(12) United States Patent
Qian et al.

(10) Patent No.: US 6,507,300 B1
(45) Date of Patent: Jan. 14, 2003

(54) VARIABLE RATE DECIMATOR

(75) Inventors: Xiaoshu Qian, Cupertino, CA (US); Nina Shu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,523

(22) Filed: Jun. 27, 2001

(51) Int. Cl.[7] ................................. H03M 3/00
(52) U.S. Cl. ........................................ 341/143; 341/61
(58) Field of Search .................... 341/143, 155, 341/141; 708/313, 319

(56) References Cited

U.S. PATENT DOCUMENTS

| | | | | |
|---|---|---|---|---|
| 5,157,395 A | * | 10/1992 | Del Signore et al. ....... | 341/143 |
| 5,689,449 A | * | 11/1997 | Saramaki et al. ........... | 708/313 |
| 6,057,793 A | * | 5/2000 | Gong et al. ................. | 341/143 |
| 6,233,594 B1 | * | 5/2001 | Tan et al. ................... | 708/313 |
| 6,295,011 B1 | * | 9/2001 | Brown ........................ | 341/83 |
| 6,304,301 B1 | * | 10/2001 | Goeckler ..................... | 348/723 |

* cited by examiner

Primary Examiner—Peguy JeanPierre
(74) Attorney, Agent, or Firm—Blakely, Sokoloff, Taylor & Zafman LLP (57) ABSTRACT

A variable rate decimator is described, intended to reduce a digital signal sample rate while maintaining a level of digital signal integrity at a relatively low cost. It is also a goal of the variable rate decimator described herein to provide a scalable decimator architecture while maintaining relatively low complexity of use.

26 Claims, 10 Drawing Sheets

Block Diagram of the Device

FIG. 3

Filter coefficients, bit width of input and output, and the gain of each block.

| blk | filter coef | gain | input bit width | output bit width |
|---|---|---|---|---|
| D2A | 1, 0, -7, 0, 38, 64, 38, 0, -7, 0, 1 | specified by gain0, range: (0:63)/32 | 13 | 10 |
| D2B | same as above | 1.5 | 12 | 13 |
| D2C | -1, 0, 9, 16, 9, 0, -1 | 1.5 | 11 | 12 |
| D2D | 1, 2, 1 | 1.5 | 11 | 11 |
| D2E | 1, 2, 1 | 1.5 | 10 | 11 |
| RS | -1,-4,-2,6,12,2,-23,-31,14,103,178, 178,103,14,-31,-23,2,12,6,-2,-4,-1 | 1.25 specified by gain1, range: (0:15)/8 | 10 | 10 |

VARIABLE RATE DECIMATOR

BACKGROUND

As digital signal processing technology increases in complexity and cost in applications such as cable modems, designers search for ways in which to reduce system cost while maintaining digital signal processing quality. For example, as Internet users demand more bandwidth, broadband technologies, such as cable modem, and Digital Subscriber Line (DSL) have responded by enabling increased processing rates in data receiving equipment.

However, increasing Internet connection bandwidth is not without a cost. As higher data rates are enabled in Internet equipment, such as cable modem receivers, complexity and cost can rise accordingly. As a result, designers continue to look for ways to cut costs without sacrificing digital signal quality.

Decimator devices are used in applications, such as cable modem receivers, to reduce the digital signal sampling rate of an input digital signal received from a cable-modem transmitter in order to enable further processing of the digital signal. In so doing, signal quality in decimator devices may be traded for system cost improvements.

However, current decimator device architectures have not enabled signal decimation to be easily scaled in order to achieve cost advantages. Furthermore, decimator devices have not been easily configurable, such that designers could easily adapt and port software between decimator devices. Scalability and adaptability are important when choosing digital signal processing devices, such as a decimator device, in order to enable reuse of software and hardware in subsequent generations of digital signal processing systems, such as cable-modem receivers.

In particular, scalable and portable decimator devices are important to cable-modem receiver designers in order to avoid having to rely on numerous decimator device architectures to achieve cost/quality targets among cable-modem designs. Relying on numerous decimator device solutions can result in increased development cost and time to market.

BRIEF DESCRIPTION OF THE DRAWINGS

The features and advantages will become apparent from the following detailed description in which.

DETAILED DESCRIPTION

A variable rate decimator is described, intended to reduce a digital signal sample rate while maintaining a level of digital signal integrity at a relatively low cost. It is also a goal of the variable rate decimator described herein to provide a scalable decimator architecture while maintaining relatively low complexity of use.

A Cable Modem Receiver

Figure 1:
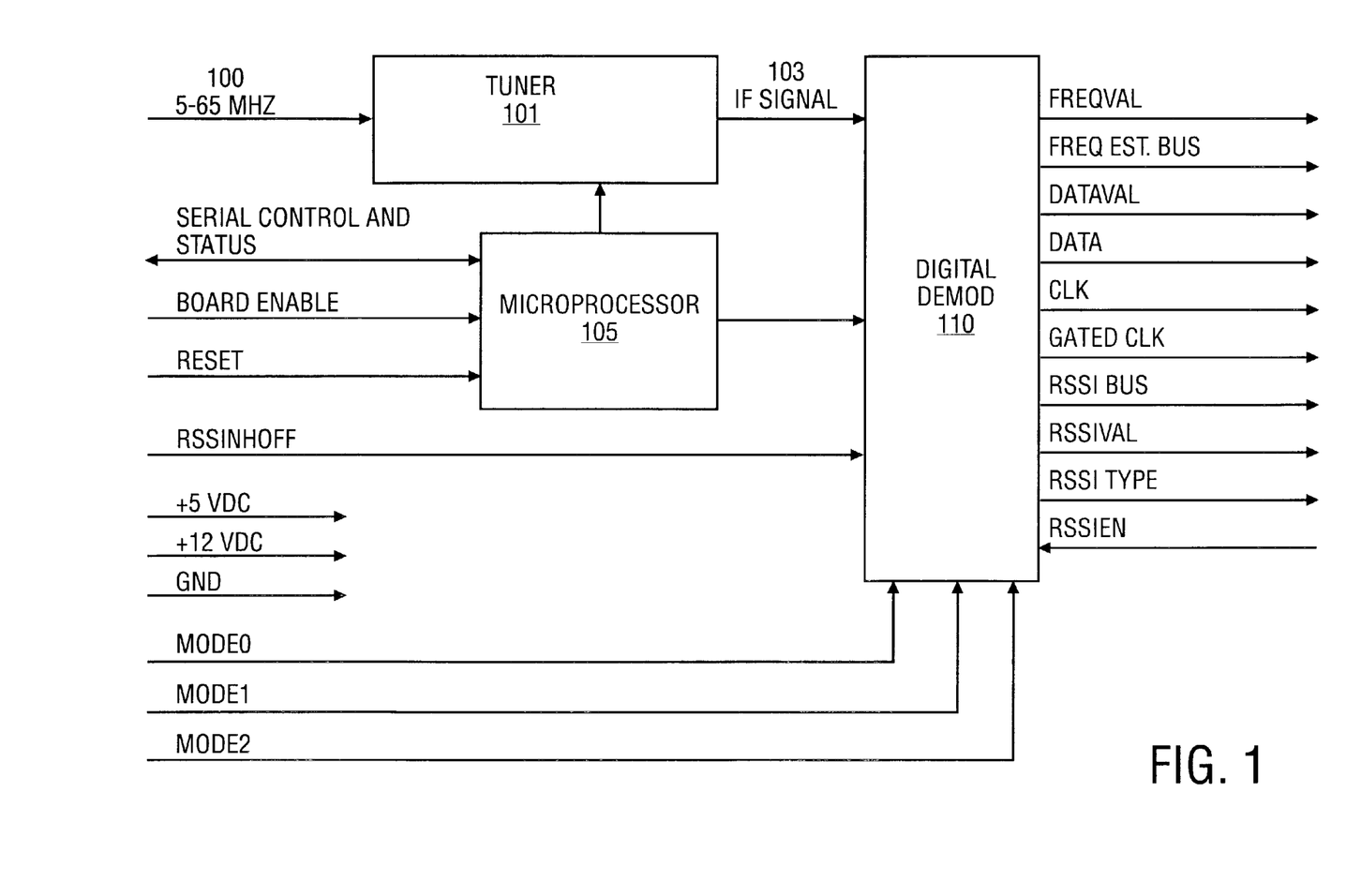
FIG. 1 is a block diagram of a cable modem receiver in accordance with one embodiment.

FIG. 1 is a block diagram of a cable modem receiver in accordance with one embodiment. The cable modem receiver of FIG. 1 consists of a tuner 101, which receives a signal from a cable modem transmitter. In one embodiment, the tuner receives a Radio Frequency (RF) signal 100 and converts it into an Intermediate Frequency (IF) signal 103 before passing the signal to a digital demodulation device 110 where the signal is digitally processed. In one embodiment, the digital processing includes sampling the IF signal, filtering the signal, then dividing (decimating) the digital signal sample rate in order to enable further digital signal processing.

Once the signal is processed by the digital demodulation device, the digital signal may be further processed before being passed to subsequent stages within the cable modem system.

A Variable Rate Decimator

Figure 2:
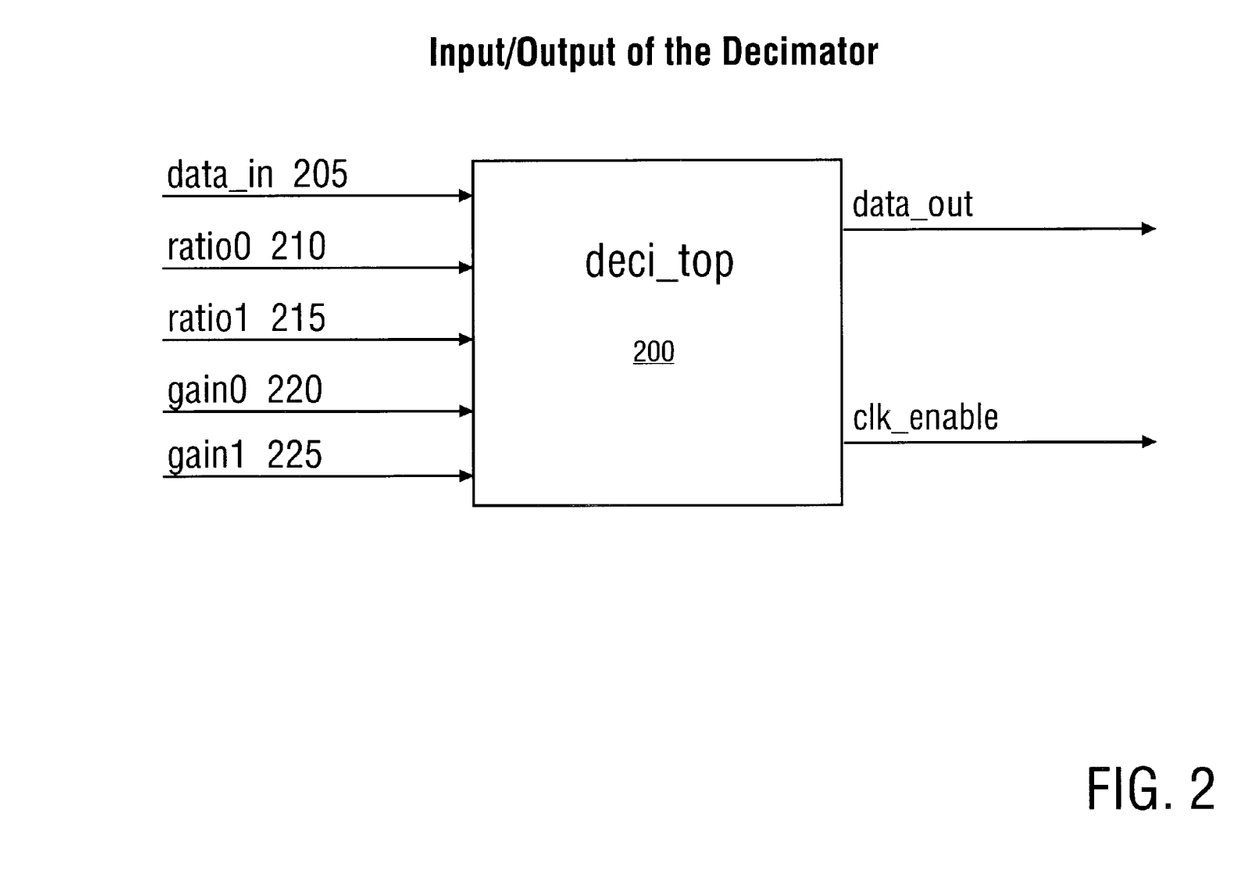
FIG. 2 is a high-level block diagram of a variable rate decimator device according to one embodiment.

FIG. 2 is a high-level block diagram of a decimator device according to one embodiment. In one embodiment the decimator unit 200 receives a digital signal of a certain sample rate on the data_in input 205 and transmits a decimated digital signal on the data_out output 230. The decimator device can decimate the input digital signal according to a decimation value controlled by the user. In one embodiment, the decimation value is controlled by two decimation ratio inputs, ratio0 210 and ratio1 215 that control a first and second stage of the decimator device, respectively.

Furthermore, the gain of an input digital signal may be adjusted to offset signal attenuation effects caused by the decimation process. In one embodiment, the gain of an input digital signal is controlled by gain inputs, gain0 220 and gain1 225, which control the gain of a first and second decimator stage of the decimator device, respectively. In one embodiment, gain0 is controlled as a function of ratio0, and gain 1 is controlled as a function of ratio 1, thereby simplifying the control of the decimator unit.

Figure 3:
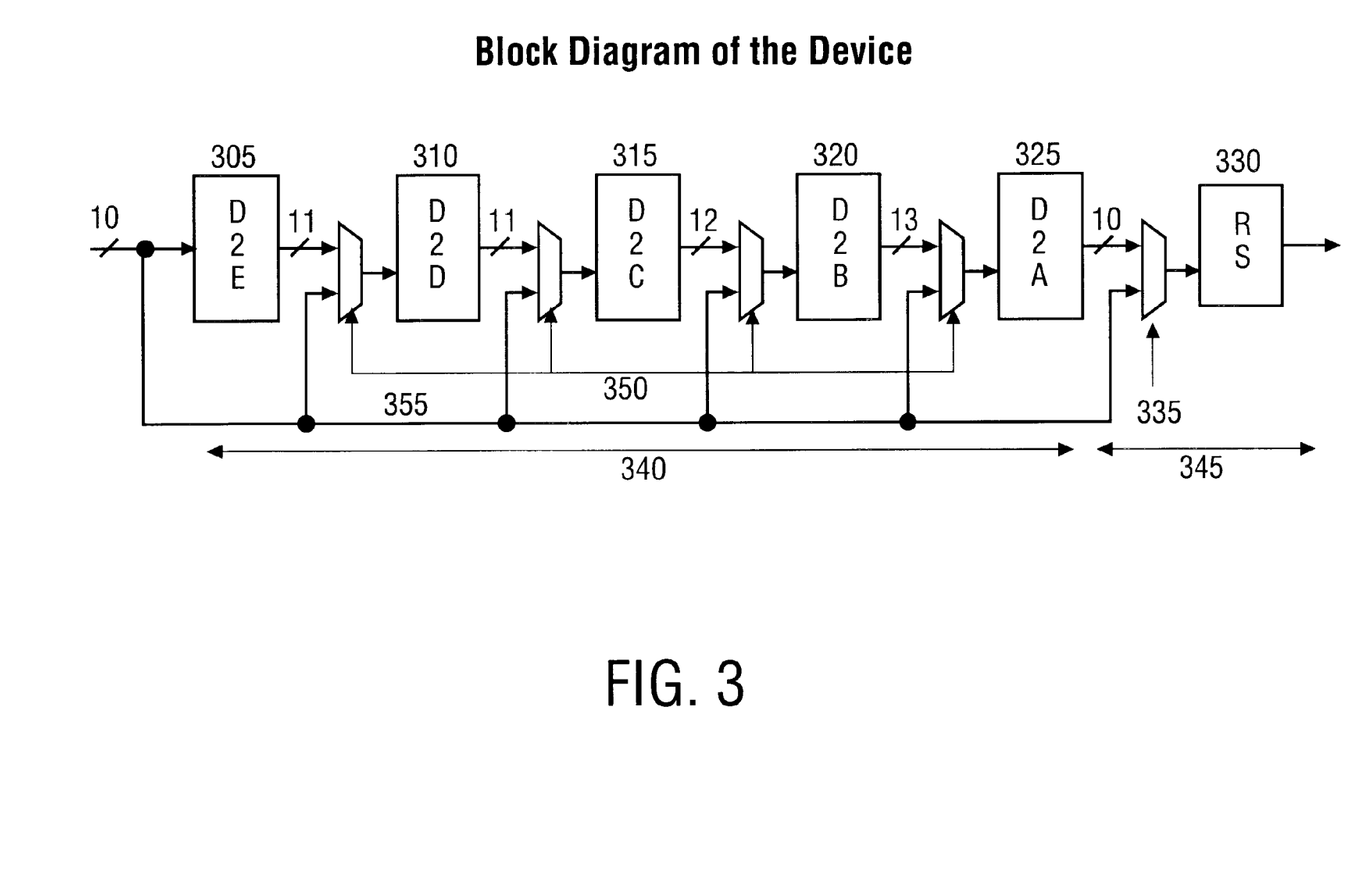
FIG. 3 is a block diagram of various stages of a variable rate decimator according to one embodiment.

FIG. 3 is a block diagram of various stages of a variable rate decimator according to one embodiment. In one embodiment, the decimator unit is divided into two main stages. The first stage 340 consists of one or more decimator units that each divide a sample rate of an input digital signal by a fixed decimation value. The decimator units can be arranged in a suitable topology so as to allow for scalability, low cost, and simplicity of use.

In one embodiment, the decimator units are arranged in a serial topology. The serial topology allows the decimator units to be of relatively low quality by enabling them to be interconnected in such a manner so as to realize a cumulative product of fixed decimation values that is greater than each fixed decimation value. By using multiple decimator units containing half-band filters of relatively low quality, cost benefits can be realized over using a fewer number of decimator units with higher quality half-band filters. Furthermore, the cumulative product of fixed decimation values may be scaled as further serial fixed-rate decimation units are enabled.

By enabling or disabling the decimation units, a cumulative decimation ratio may be increased or decreased accordingly. For example, in one embodiment, each decimator unit is a divide-by-two decimator unit, which divides a digital signal sample rate by two. Therefore, to achieve a decimation ratio of 1/2 a user would enable D2A 325 while disabling D2B–D2E 320, 315, 310, 305. Similarly, in order to achieve a cumulative decimation ratio of 1/16, a user would enable D2A–D2D while disabling D2E. The desired decimation ratio of 1/16 is realized by multiplying the decimation ratio of each enabled fixed-rate decimator unit (e.g., 1/2*1/2*1/2*1/2=1/16).

In other embodiments, a desired cumulative decimation ratio may be achieved by enabling a non-adjacent sequence of enabled decimator units. Furthermore, in other embodiments, a desired cumulative decimation ratio may be achieved by enabling decimator units of varying fixed decimation values, thereby affecting the number of decimator units that must be enabled to achieve a particular cumulative fixed decimation value.

The order in which decimator units are enabled to achieve a particular cumulative fixed decimation value is determined by decoder units 350 that intercouple the decimator units. In one embodiment, the decoder units are enabled to receive a control signal 355 consisting of a number of bits. The number of bits may be determined by the number of decimator units intercoupled in a series topology. The bits may then be decoded so as to enable the appropriate decimator units necessary to achieve a particular cumulative fixed decimation value. For example, in one embodiment, the decoder units decode a control signal consisting of 3 bits that are decoded to enable any of 5 decimator units. The order of enabled decimator units necessary to achieve a particular cumulative fixed decimation value is sequential starting with D2A when the control signal is of value 0h. Likewise, D2A and D2B are enabled when the control signal is 01h, 02h, and so forth.

A digital signal represented by a number of bits may be represented with more or fewer bits as the signal propagates through a serially intercoupled array of decimator units. Using extra bits to represent a digital signal may be necessary to compensate for signal quality loss caused by decimator units. For example, in one embodiment, an input digital signal consisting of 10 bits is propagated from D2E through D2A, all of which are enabled to decimate the signal by a value of 1/2 to achieve a cumulative fixed-rate signal decimation value of 1/32.

However, imperfections in digital filters used in the decimator units may cause signal integrity, and therefore information contained within the signal, to be compromised as the signal propagates from one fixed-rate decimator unit to the next. It may therefore be necessary to impose extra bits into the digital signal as the digital signal propagates through the decimator units. In one embodiment, one bit is added to the 10-bit input signal after the signal propagates through the D2E fixed-rate decimator unit for a total of 11 bits. More bits may be imposed on the digital signal as it propagates through subsequent enabled decimator units. However, when the signal propagates through the final fixed-rate decimator unit (D2A, in one embodiment), the digital signal is truncated back to the original 10 bits, thereby preserving as much signal integrity as possible while maintaining the original signal width for subsequent filtering and processing.

In addition to degradation in signal integrity caused by the limitations of digital filters within the decimator units, signal integrity may also be degraded by attenuation effects as the digital signal propagates through multiple decimator units. In order to compensate for signal integrity loss from attenuation, each enabled fixed-rate decimator unit may impose a gain on the signal as it decimates the signal sample rate. In one embodiment, the gain of some of the decimator units is fixed, while the gain of other fixed-rate decimator unit are variable. For example, in one embodiment, the gain of decimator units D2B–D2E is constant whereas the gain of D2A is specified by gain0 (FIG. 1). In one embodiment, gain0 may vary as a function of the cumulative fixed decimation value indicated by ratio0 (FIG. 1), thereby adjusting the gain of the digital signal automatically as a function of the amount of decimation experienced by the digital signal.

Figure 4:
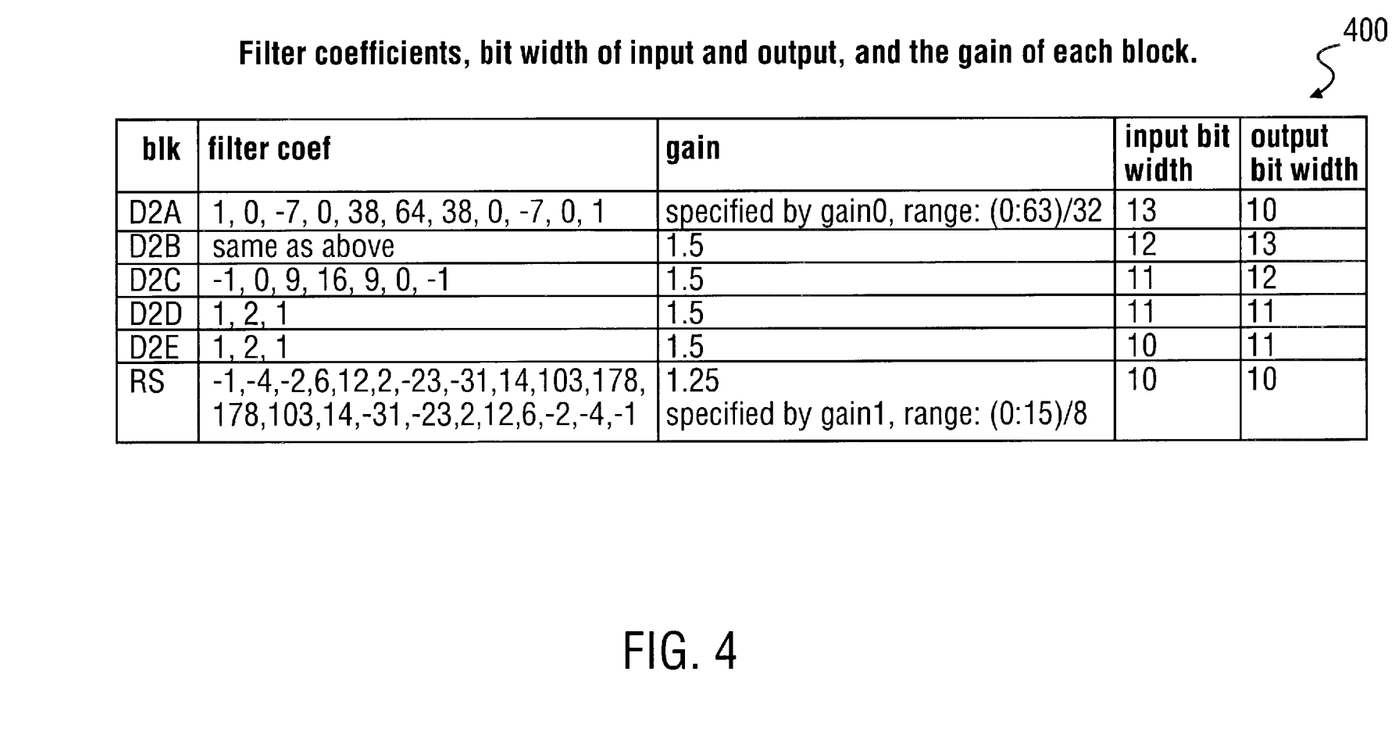
FIG. 4 is a table illustrating filter coefficients, gain, and input/output widths within a variable rate decimator according to one embodiment.

FIG. 4 shows a table of possible gain values of fixed-gain decimator units as well as the range of gain values for variable-gain decimator units. In one embodiment, decimator units, D2B, D2C, and D2D impart a gain of 1.5 on a digital signal when enabled, whereas D2E imparts a gain of 1.25. Furthermore, decimator unit, D2A imparts a variable gain within the range of (0:63)/32 when enabled. In other embodiments, the fixed-gain value and the variable-gain range may have different values than described above. In one embodiment, the variable and fixed-gain values depend on the particular signal attenuation effects of the filters used in the decimator units as well as the signal quality needs of the system in which the decimator units are used. In one embodiment, the variable gain value is a function of the decimation value specified by the ratio0 signal.

FIG. 3 further illustrates a resampler unit 330 connected to the D2A decimator unit by a decoder unit 335 similar to those intercoupling the decimator units to each other. In one embodiment, the decimation ratio of the resampler block ranges from 1 through 5:2 and is specified by the input1 with 24-bit precision to realize a variable decimation value. When enabled, the resampler unit may further divide a sample rate of a digital signal after it has been divided by the decimator units, thereby creating an effective overall digital signal decimation value that is equal to the arithmetic product of the cumulative product of fixed decimation values and the resampler variable decimation value. For example, to realize an overall decimation value of 23.334, ratio0 would be configured to enable the last four D2 blocks (D2A through D2D) to achieve a decimation ratio of 16 and configure ratio1 to be 1:458375, thereby enabling an overall decimation ratio of 1.458375*16 (23.334).

In order to compensate for signal attenuation caused by the resampler unit, a resampler gain controlled by the gain1 signal may be imposed on the digital signal by the resampler unit. In one embodiment, gain1 is varied as a function of ratio1, which controls the decimation value of the resampler unit, thereby automatically adjusting the digital signal gain as a function of the decimation experienced by the digital signal from the resampler unit. Furthermore, when a cumulative decimator unit gain is multiplied with the resampler gain, an overall digital signal gain can be realized.

Digital Filters

Decimation of a digital signal sample rate can be realized by the use of digital signal filters. A digital signal filter can be represented by its impulse response function or transfer function. An impulse response function is a filter's output function in response to an impulse function, which has a unit value of 1 at sample point 0 and has a value of 0 at all other sample points. A transfer function can be defined as the Fourier Transform of the impulse response function.

A digital filter's response to an impulse function can be represented by a quadratic formula containing a summation of delay functions each weighted by a coefficient. For example, a digital half-band filter's impulse response as a function of delay function, d(n), can be represented by the quadratic formula, $H(d)=h0+h1d(n)+h2d(n)2+$ ... etc., where h0, h1, and h2 are weighting coefficients for each term of the impulse response function. A half-band filter is characterized by its impulse response shape, in which only half of a filtered signal's frequency band and its negative mirrored image is captured.

In general, a digital filter response quality will be affected by the number of terms realized in its transfer function. For example, a 3-term quadratic formula representation of a half-band filter—$H(d)=h0+h2d(n)2+h4d(n)4$—may produce an impulse response similar to that illustrated in FIG. 10a.

Figure 10A:
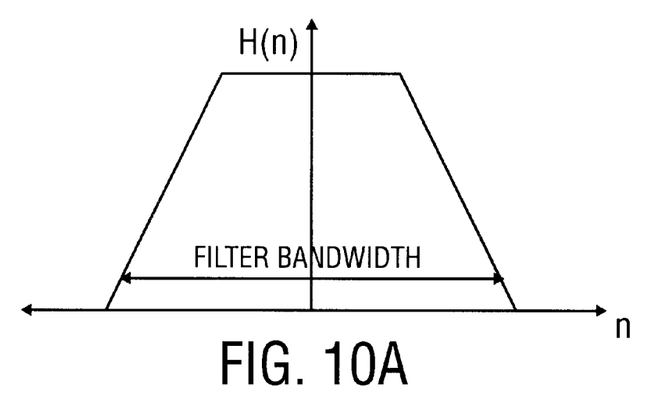
FIG. 10a illustrates a half-band filter according to one embodiment.
Figure 10B:
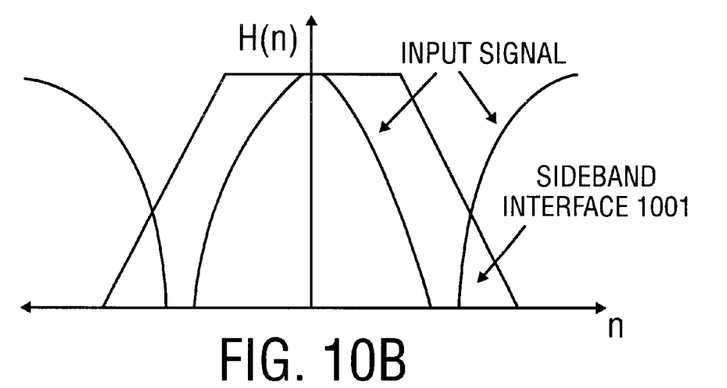
FIG. 10b illustrates overlapping spectral side-bands of a half-band filter.

When an input signal is passed through a half-band filter similar to that of FIG. 10a, the signal integrity may suffer by capturing neighboring frequency bands within the filter's bandwidth, as illustrated in FIG. 10b.

The neighboring frequencies 1001 captured in the same filter band as the intended signal 1005 can cause aliasing in the digital signal. Aliasing causes the signal quality to be reduced by imposing unwanted spectral noise into the signal. However, by increasing the number of terms in the quadratic formula representing the transfer function of the half-band filter, the filter quality can be improved such that only the intended signal is captured within the filter bandwidth. For example, by using more non-zero terms in the above quadratic formula, a transfer function for a filter can be represented by the function, $H(d)=h0+h1d(n)+h2d(n)2+h3d(n)3+h4d(n)4$, resulting in a transfer function similar to that illustrated in FIG. 10c.

Figure 10C:
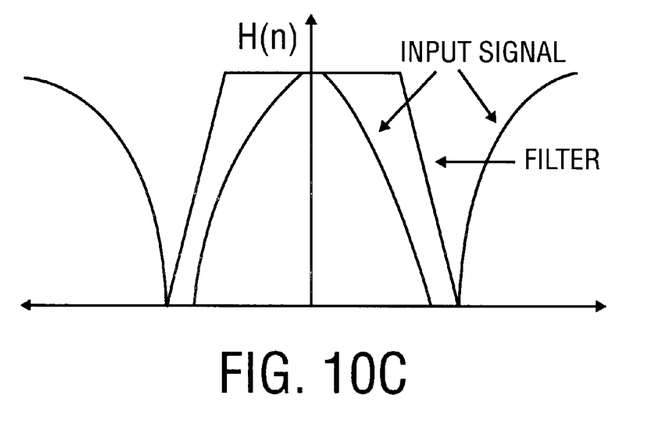
FIG. 10c illustrates a digital signal being filtered by a half-band filter according to one embodiment.

In FIG. 10c, the intended frequency range of the signal is captured within the filter bandwidth, resulting in improved signal quality for future processing.

In one embodiment, several half-band filters are used to divide the input signal sample rate by a factor of two. Each half-band filter may be of varying quality in order to optimize filter cost and signal integrity. For example, in one embodiment a variable-rate decimator may contain five fixed-rate divide-by-two decimator units connected together in a series configuration, such that an input signal passes through each before being resampled by a resampler unit.

Figure 6:
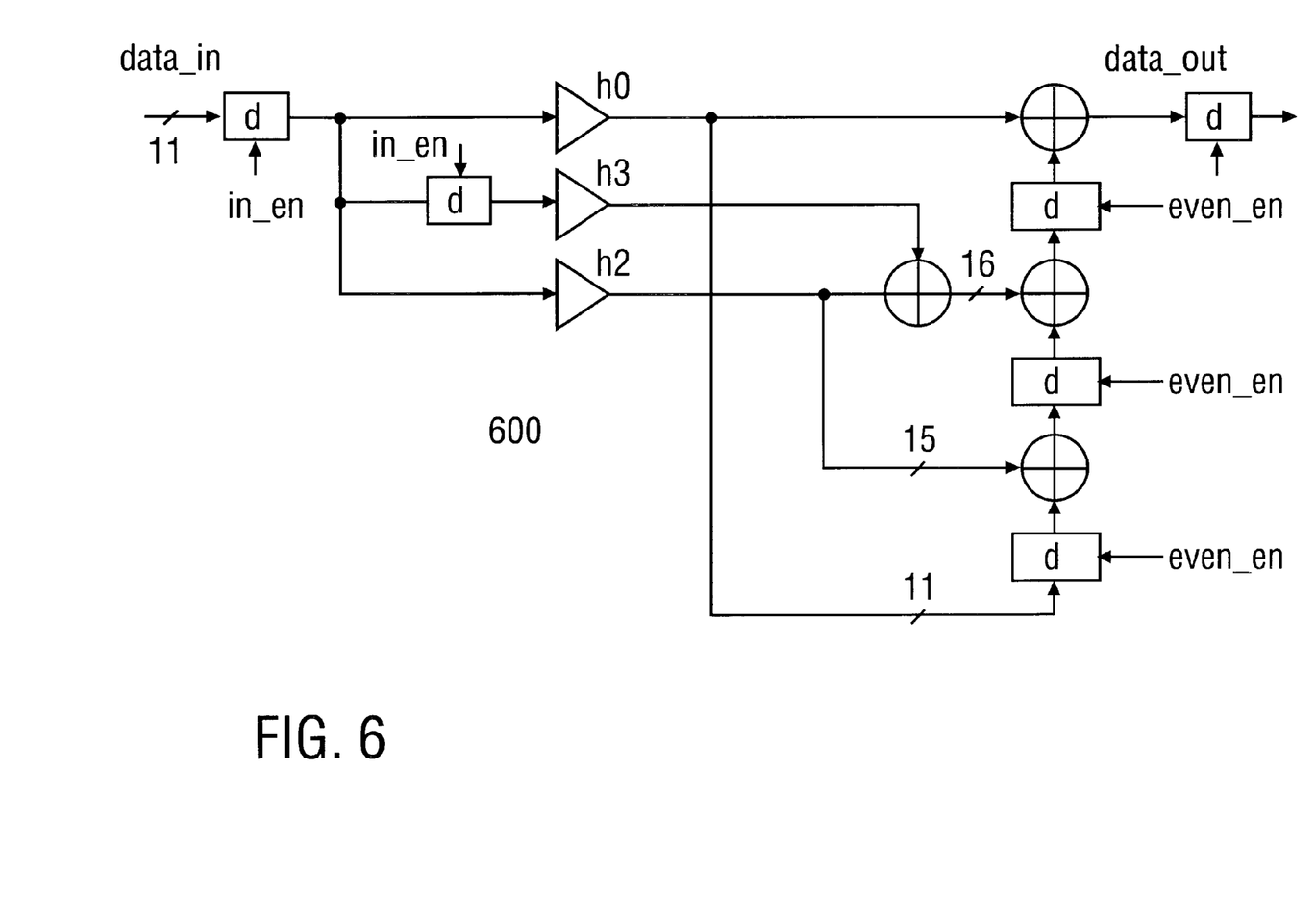
FIG. 6 is a schematic of a half-band filter used in a variable rate decimator according to one embodiment.
Figure 7:
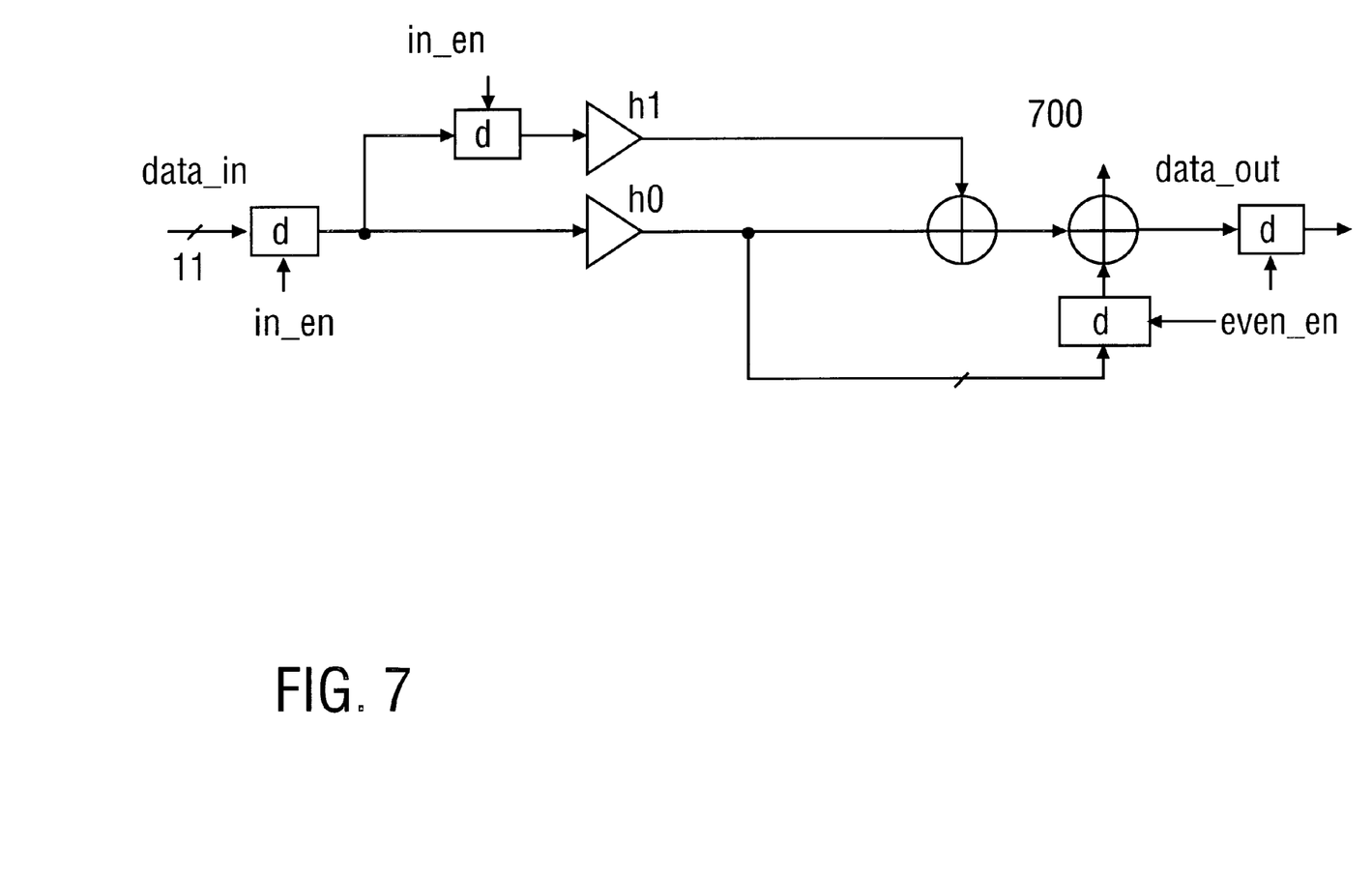
FIG. 7 is a schematic of a half-band filter used in a variable rate decimator according to one embodiment.

Decimator units D2D and D2E in the series of decimator units may contain a digital half-band filter as illustrated in FIG. 7. The half-band filter of FIG. 7 is represented by a 3-term quadratic formula, which is realized by a digital half-band filter circuit. Decimator unit D2C may contain a half-band filter illustrated in FIG. 6. The half-band filter of FIG. 6 is represented by a 5-term quadratic formula, which is realized by a digital half-band filter circuit.

Figure 5:
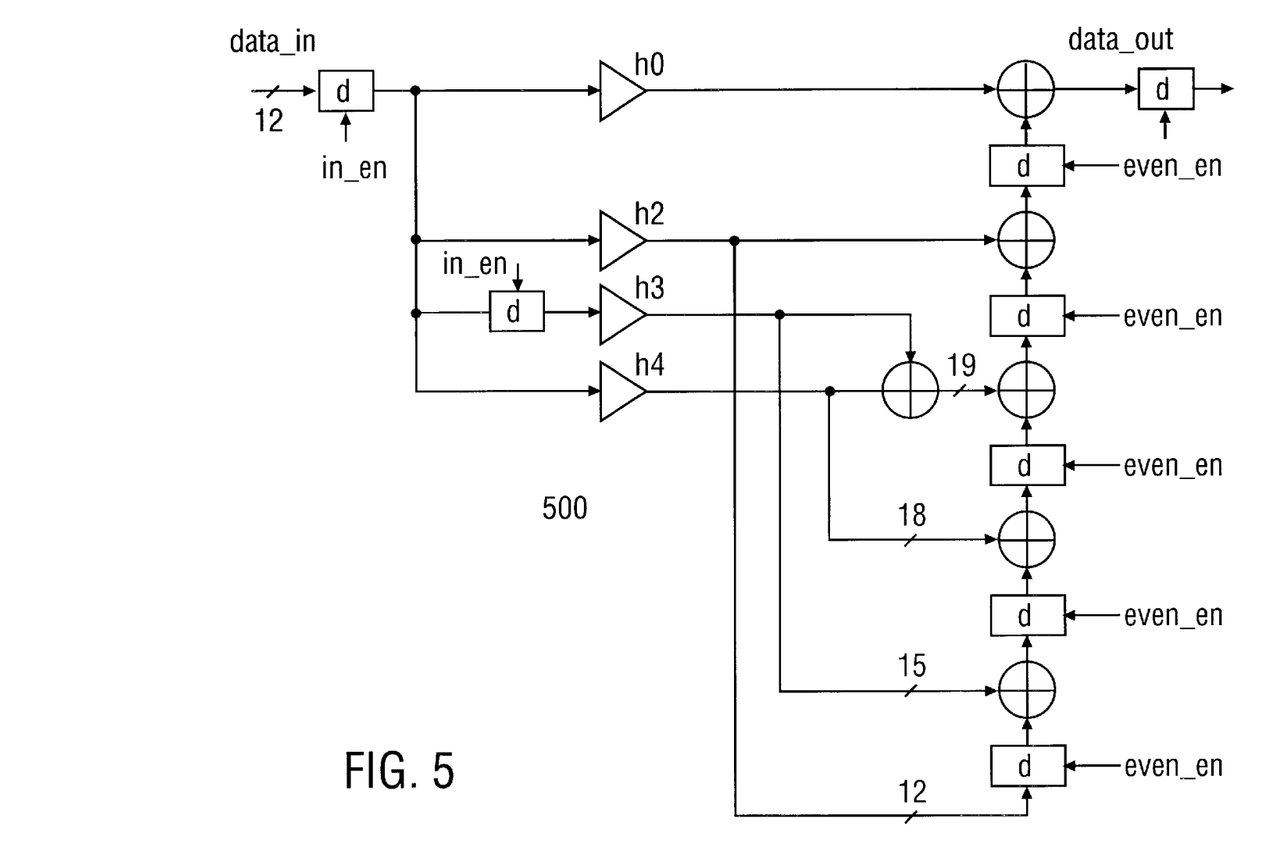
FIG. 5 is a schematic of a half-band filter used in a variable rate decimator according to one embodiment.

Decimator units D2A and D2B may contain a half-band filter illustrated in FIG. 5. The half-band filter of FIG. 5 is represented by a 7-term quadratic formula, which is realized by a digital half-band filter circuit.

By varying the number of terms used in the quadratic formulas representing each digital half-band filter, filter quality can be modified to optimize cost while realizing a desired signal integrity, as previously discussed. The values of the coefficients used in the quadratic formulas representing each half-band filter may vary and are determined by the desired filter quality and digital output-signal characteristics. The coefficients used in one embodiment are summarized in the table shown in FIG. 4. In one embodiment, half-band filters used in the decimator units are of a progressively increasing quality due to the progressively increasing number of terms realized in the half-band filters used within the decimator units. For example, decimator units D2D and D2E may be represented by quadratic formulas containing three terms. Decimator unit D2C may be represented by a quadratic formula containing five terms. Decimator units D2B and D2A may be represented by a quadratic formula containing seven terms.

In each of the digital filters illustrated in FIGS. 5, 6, and 7, every other filter "tap" is enabled by using a non-zero coefficient in the corresponding quadratic equation terms. By using non-zero decimator filter coefficients in every other quadratic formula term, fewer circuit elements may be used to realize the corresponding digital filter, resulting in lower filter cost. However, lower filter quality also results by implementing only every other filter tap relative to a filter that implements non-zero coefficients in every term of a corresponding quadratic formula. For example, although cheaper to implement, the quadratic formula, $H(d)=h0+h2d(n)2+h4d(n)4$, would produce a lower quality impulse response than a filter that implemented the quadratic formula, $H(d)=h0+h1d(n)+h2d(n)2+h3d(n)3+h4d(n)4$. However, by implementing half-band filters of relatively low quality while enabling decimator units to be coupled in series, signal quality can be maintained while enabling lower filter cost. Decimator units, D2A, D2B, D2C, D2D, and D2E may contain digital half-band filters with coefficients shown, but other coefficients may also be used.

Half-band filter cost is further reduced by virtue of filter symmetry. Symmetric filters are those that have the same filter response characteristics about a base frequency. In one embodiment, the half-band filter response is symmetric about a base frequency equal to the sample frequency (rate) of the digital signal to be filtered.

In one embodiment, a digital signal passed through the fixed-rate divide-by-two decimator units described above may experience a digital signal sample rate reduction by a divisor of 1, 2, 4, 8, 16, or 32, depending on the number of decimator units that have been enabled by a 3-bit input control signal. In order to more precisely decimate a a digital signal, a variable-rate resampler unit may be connected in series with the decimator units as shown in FIG. 3.

In one embodiment, the decimation ratio of the resampler unit ranges from 1 through 5:2 and is specified by input ratio1 with 24-bit precision. The gain of the resampler unit is specified by input gain1, which in one embodiment, is controlled automatically by the decimation value specified by ratio1. Therefore, to achieve an overall decimation value of 23.334, for example, ratio0 would be used to enable the last four decimator units (D2A through D2D) to achieve a decimation ratio of 16 and ratio1 would be used to specify a resampler unit decimation ratio of 1:458375. An overall ratio of 23.334 is achieved by multiplying the decimation ratios of the cumulative fixed-rate decimator value and the variable-rate decimator value (16*1.458375).

Figure 8:
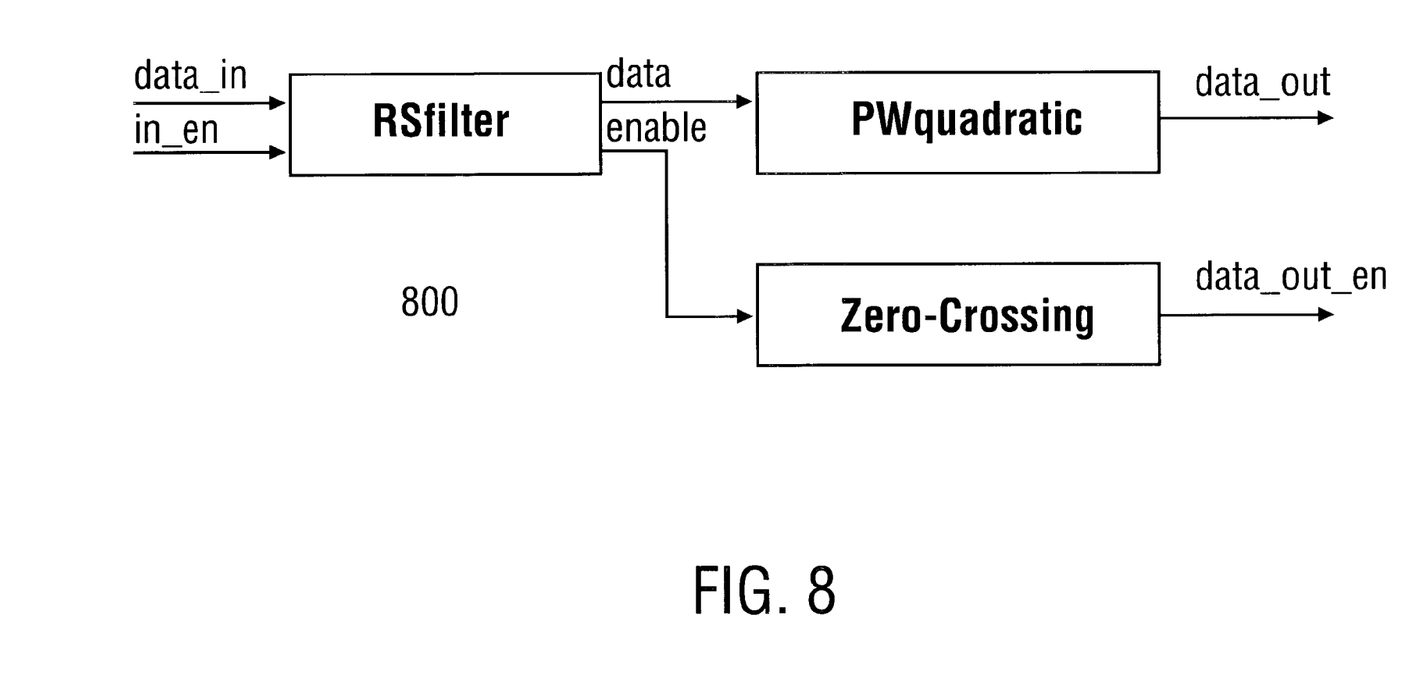
FIG. 8 is a block diagram of a resampler unit used in a variable rate decimator according to one embodiment.
Figure 9:
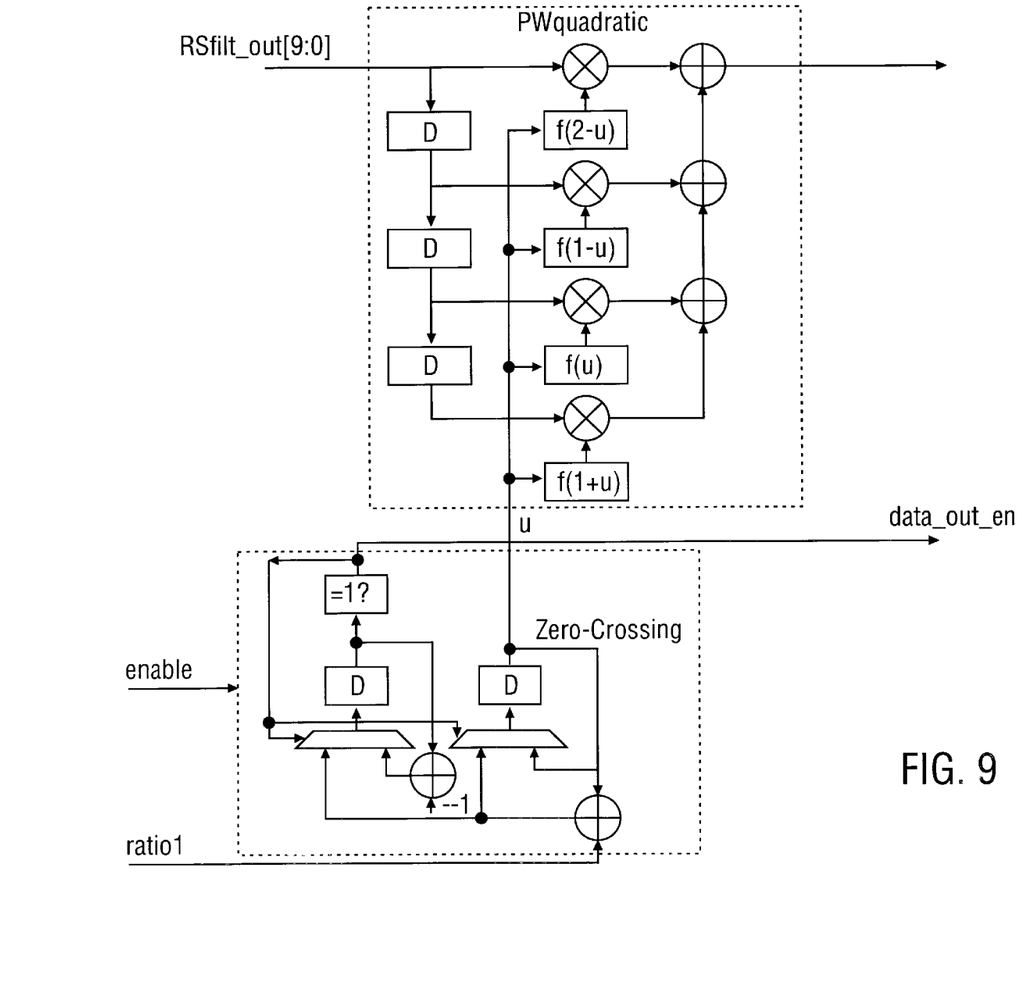
FIG. 9 illustrates one implementation of a PW quadratic and Zero-crossing circuit of a resampler unit according to one embodiment.

In one embodiment, the variable-rate resampler unit contains a digital filter blocks shown in FIG. 8. The PW Quadratic and Zero-crossing blocks may be realized, in one embodiment, by the digital filter circuits illustrated in FIG. 9. Other filter circuits may be used to realize the resampler unit in other embodiments depending on factors, such as cost, decimation capabilities, and desired signal quality.

While this invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed:

1. An apparatus comprising:

a series of decimator units, said series of decimator units comprising a plurality of half-band filters comprising a progressively increasing number of filter coefficients, said series of decimator units being enabled to divide a signal sample rate according to a plurality of fixed decimation values and produce a plurality of decimator gains, at least one of said plurality of decimator gains being a cumulative product of said plurality of fixed decimation values.

2. The apparatus of claim 1 further comprising at least one resampler unit, said at least one resampler unit being coupled to at least one of said series of decimator units, said at least one resampler unit being enabled to divide a signal sample rate according to a variable decimation value, said at least one resampler unit being enabled to produce a resampler gain.

3. The apparatus of claim 2 wherein said resampler gain is a function of said variable decimation value.

4. The apparatus of claim 3 further comprising a plurality of decoder units, said plurality of decoder units being coupled to said series of decimator units, at least one of said plurality of decoder units being further coupled to said at least one resampler unit, said plurality of decoder units being enabled to decode at least one control signal, said at least one control signal being decoded to enable at least one of said series of decimator units or said at least one resampler unit.

5. The apparatus of claim 4 wherein said cumulative product is proportional to an enabled number of said series of decimator units.

6. The apparatus of claim 5 wherein an overall signal gain is realized by multiplying said decimator gain and said resampler gain.

7. The apparatus of claim 6 wherein an overall signal decimation value is realized by multiplying said cumulative product of said plurality of fixed decimation values and said resampler decimation value.

8. The apparatus of claim 1 wherein said signal sample rate may be further divided by coupling additional decimator units to said series of decimator units.

9. The apparatus of claim 1 wherein said at least one half-band filter is symmetric and every other filter tap is zero.

10. A method comprising:

receiving a signal, said signal having an input signal sample rate and an input signal gain;

dividing said input signal sample rate by a first decimation ratio, said dividing said input signal sample rate by said first decimation ratio resulting in an intermediate signal sample rate;

filtering said signal, said filtering resulting from propagating said signal through at least one of a series of filtering steps having increasingly definite impulse response characteristics;

dividing said intermediate signal sample rate by a second decimation ratio, said second decimation ratio having a greater range than said first decimation ratio, said dividing said intermediate signal sample rate by said second decimation ratio resulting in an output signal sample rate.

11. The method of claim 10 wherein said first decimation ratio is proportional to an enabled number of a series of decimator units.

12. The method of claim 11 wherein said enabled number of said series of decimator units is determined by a first decimation control signal.

13. The method of claim 12 wherein said second decimation ratio is determined by a second decimation control signal, said second decimation control signal enabling at least one resampler unit to divide said intermediate signal sample rate by said second decimation ratio.

14. The method of claim 13 further comprising compensating for attenuation to said input signal gain, said attenuation resulting, at least in part, from said input signal propagating through said series of decimator units and said at least one resampler unit.

15. The method of claim 14 wherein said compensating comprises adjusting said input signal gain as a function of said first decimation ratio, adjusting said input signal gain resulting in an intermediate signal gain.

16. The method of claim 15 wherein said compensating further comprises adjusting said intermediate signal gain as a function of said second decimation ratio, adjusting said intermediate signal gain resulting in an output signal gain.

17. The method of claim 16 wherein said first decimation ratio is proportional to an enabled number of said series of decimator units, said enabled number of said series of decimator units each being enabled to divide said input signal sample rate by a fixed value.

18. The method of claim 10 wherein said at least one of a plurality of relatively low-quality filtering steps comprises propogating said signal through at least one half-band filter, said at least one half-band filter being symmetric and having every other filter tap be zero.

19. A system comprising:

a tuner;

a microprocessor, said microprocessor being coupled to said tuner;

a digital demodulation device, said digital demodulation device being coupled to said microprocessor, said digital demodulation device comprising a variable-rate decimator, said variable-rate decimator comprising a series of decimator units, said series of decimator units comprising a plurality of half-band filters having a progressively increasing number of filter taps.

20. The system of claim 19 wherein said variable-rate decimator further comprises a resampler unit, said resampler unit being coupled to at least one of said series of decimator units.

21. The system of claim 20 wherein said series of decimator units are enabled to divide a signal sample rate according to a plurality of fixed decimation values and produce a plurality of decimator gains, at least one of said plurality of decimator gains being a function of a cumulative product of said plurality of fixed decimation values.

22. The system of claim 21 wherein said at least one resampler unit is enabled to divide a signal sample rate according to a variable decimation value, said at least one resampler unit being enabled to produce a resampler gain.

23. The system of claim 22 wherein said cumulative product is proportional to an enabled number of said series of decimator units.

24. The system of claim 23 wherein an overall signal gain is realized by multiplying said decimator gain and said resampler gain.

25. The system of claim 24 wherein an overall signal decimation value is realized by multiplying said cumulative product of said plurality of fixed decimation values and said resampler decimation value.

26. The system of claim 25 wherein said signal sample rate may be further divided by coupling additional decimator units to said series of decimator units.

* * * * *